United States Patent [19]

Murski

[11] 4,319,955

[45] Mar. 16, 1982

[54] AMMONIACAL ALKALINE CUPRIC ETCHANT SOLUTION FOR AND METHOD OF REDUCING ETCHANT UNDERCUT

[75] Inventor: Kenneth J. Murski, West Milford, N.J.

[73] Assignee: Philip A. Hunt Chemical Corp., Palisades Park, N.J.

[21] Appl. No.: 204,216

[22] Filed: Nov. 5, 1980

[51] Int. Cl.$^3$ ............................ B44C 1/22; C23F 1/00
[52] U.S. Cl. .................................. 156/659.1; 156/666; 252/79.5
[58] Field of Search ...................... 156/666, 664, 659.1; 252/79.5, 79.4, 156; 260/157, 159; 548/373

[56] References Cited

U.S. PATENT DOCUMENTS

| | | | |
|---|---|---|---|
| 3,773,577 | 11/1973 | Shibasaki et al. | 156/666 |
| 3,948,703 | 4/1976 | Kushibe | 156/666 |
| 4,060,447 | 11/1977 | Nelson | 156/666 |
| 4,116,699 | 9/1978 | Rooney | 252/79.4 |

*Primary Examiner*—Edward C. Kimlin
*Assistant Examiner*—F. V. Wine
*Attorney, Agent, or Firm*—Kirschstein, Kirschstein, Ottinger & Cobrin

[57] ABSTRACT

An improved ammoniacal alkaline etchant solution and method of reducing etchant undercut for use in etching copper and copper-containing alloy traces on substrates having resist-coated areas and non-coated areas, which reduces the amount of undercutting beneath the resist-coated areas that lie above the copper traces. The improved etchant solution contains an organic undercut inhibitor which can be either 5-nitro-1H indazole or pyrazole and the improved method includes the step of incorporating said organic undercut inhibitor in a standard ammoniacal alkaline cupric etchant solution. The organic undercut inhibitor causes the formation of a bath-insoluble, physically weak, etch-resistant film on the copper substrate. Said film serves to protect the side walls of an etched depression and thereby diminishes undercutting.

5 Claims, No Drawings

AMMONIACAL ALKALINE CUPRIC ETCHANT SOLUTION FOR AND METHOD OF REDUCING ETCHANT UNDERCUT

BACKGROUND OF THE INVENTION

1. Field of the Invention

This invention generally relates to etching copper and copper-containing alloys and, more especially, to a new and improved ammoniacal alkaline cupric etchant solution for, and method of, decreasing the amount of etchant undercut on substrates in which copper or copper-containing alloys are present.

2. Description of the Prior Art

Traditionally, acid based etchants were generally employed during the emerging years of the copper printed circuit industry. This was a natural evolution from the experience gained with etchants designed originally for photo-engraving applications. However, the requirements of copper printed circuit makers were different from those of photo-engravers, and acid etchant formulations were modified to fill their needs. As a result, during those early years, ferric chloride, chrome/sulfuric acids and ammonium persulfate were predominant as electronic grade etchants for the printed circuit industry.

During the mid-sixties, a new approach to dissolving metallic copper appeared. This new technology was not based on the traditional acid systems but on an alkaline system. These new alkaline etchants were aqueous ammoniacal solutions containing carbonate ions and a potent oxidizing agent, sodium chlorite. This early alkaline etchant successfully etched copper circuit boards without significantly attacking solder plate, but exhibited a limit etch rate and a limited total copper loading capacity.

In the early nineteen seventies alkaline etchants were further improved in etch rate and total copper loading capacity by the addition of chloride ions to essentially the same ammoniacal, chlorite-containing etchants previously described.

The three-step oxidation mechanism of metallic copper resulting with these alkaline systems is best understood by studying the following three equations.

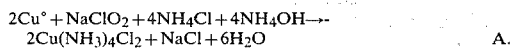

$$2Cu^\circ + NaClO_2 + 4NH_4Cl + 4NH_4OH \rightarrow$$
$$2Cu(NH_3)_4Cl_2 + NaCl + 6H_2O \quad\quad A.$$

Equation A illustrates the formation of cupric ions from the reaction of chlorite on metallic copper.

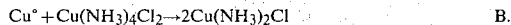

$$Cu^\circ + Cu(NH_3)_4Cl_2 \rightarrow 2Cu(NH_3)_2Cl \quad\quad B.$$

Equation B illustrates the use of the just-formed cupric ion from Equation A as an oxidizing agent on additional metallic copper to form cuprous ions.

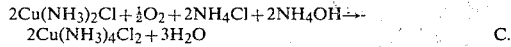

$$2Cu(NH_3)_2Cl + \tfrac{1}{2}O_2 + 2NH_4Cl + 2NH_4OH \rightarrow$$
$$2Cu(NH_3)_4Cl_2 + 3H_2O \quad\quad C.$$

Equation C illustrates the secondary oxidation of the cuprous ions formed in Equation B via aeration to useful cupric ions for further metallic copper etching.

From the foregoing chemical reactions, one can see the basic elements contributing to the modern steady state ammoniacal alkaline cupric etching systems. If one has an active etchant, based on cupric ions, and a suitable cupric ion level can be maintained by aerial oxidation of cuprous ions formed in situ during the etching of metallic copper, the potential of replenishable alkaline etchant becomes clear. As metallic copper is etched, cuprous ions are formed and aerially oxidized to the active etchant species, i.e. cupric ions. While this is occurring fresh non-copper-containing replenisher is added. This replenisher is so formulated as to refortify those etchant components that are depleted during etching. The replenisher addition rate is based on a change of an etchant characteristic, e.g. density, as a function of increasing copper concentration. Representative uses of ammoniacal alkaline cupric etching solutions may be found in U.S. Pat. Nos. 3,705,061; 3,717,521; 3,753,818; 3,809,588 and 3,919,100.

The alkaline ammoniacal cupric etching solutions previously discussed are the most frequent type of solution used for etching microcircuits and printed circuit boards due to the fact that they can maintain a high sustained etching rate by the addition of the aforementioned simple non-copper-containing replenisher solution.

Ammoniacal alkaline cupric etchant solutions dissolve copper not only in a generally vertical direction (perpendicular to the planar substrate), as is desired, but also undesirably concurrently etch in a generally horizontal direction underneath the edges of the resist-coated areas; that is to say, the etchant solutions attack the side walls of the depressed etched areas. This is commonly referred to as undercutting.

Undercutting is undesirable, because it causes the cross-sections of the remaining unetched copper areas to be non-uniform and non-predictable; under some conditions removes edge support for the remaining unetched copper areas; reduces the effective current-carrying capacity of the remaining unetched copper areas; in some cases, completely removes the copper; and may cause shorting between adjacent remaining unetched copper areas when metallic etch resists are used, these tending to break away as slivers to connect adjacent circuits; etc.

Undercutting presents a particular problem when one is etching very dense, fine line circuits. The electronic industry is constantly striving to put more components on a printed circuit board and to make the components themselves more complicated. To connect all these components more and more circuits are packed into a given area. The only way to fit them in is to make the circuit lines narrower and closer together. As the circuit lines become narrower, a fixed amount of undercutting becomes more significant; i.e. becomes a larger percentage of circuit line width.

To achieve a reduction in the amount of undercutting, many parameters had to be met. These include:

1. Single Liquid Phase

The etchant should be a single phase liquid, preferably aqueous, system. Most undercut controlling formulations used in the printing industry rely on an oleophilic member coupled to an aqueous acid etchant. The nature of current spray etching equipment technology does not allow for practical application of such a two-phase etching system.

2. Active Components Must Not Attack Polyvinyl Chloride

Since most etching equipment in the printed circuit industry is manufactured from one or more varieties of polyvinyl chloride, an active undercut-inhibiting chemical component must not be a compound that would attack or soften polyvinyl chloride.

3. No Reduction in Etch Rate

To advance the printed circuit quality etching art at the cost of reduced production output would be self-defeating. Unfortunately, many undercut inhibiting components reduced etch rate.

4. No Increase in Cost Per Ounce of Copper Etched

Some undercut inhibitors may have advantages in undercut control but are so costly as not to be marketable.

5. Formulate Etchant to Operate at Higher Copper Concentrations

In order to further increase the cost efficiency of the new product it would be advisable to operate at 20 to 22 ounces per gallon of copper as compared with the prior 16 to 18 ounces/gallon ammoniacal alkaline cupric etchant formulations.

It is known to reduce undercutting by minimizing the time that the copper remains in the etchant solution, and also by operating the ammoniacal alkaline cupric etchant solution at a predetermined optimum chemical balance. However, despite these precautions, some undercutting still occurs, thereby resulting in poor electrical performance and poor mass production reliability.

U.S. Pat. No. 4,116,699 discloses an organic additive for use in acidic aluminum polishing solutions to prevent transfer etch after the substrate has been removed from the etchant solution. Although generally satisfactory for its intended purpose, the aluminum polishing solution disclosed in the aforesaid patent has not been demonstrated to be effective in ammoniacal alkaline cupric etchant solutions, nor has it been shown to prevent undercutting, particularly when the substrate is in the etchant bath. Further, the aluminum polishing solution disclosed in this patent simply reduces the attack of the etchant on the total surface and does not produce a selective reduction of etching on a vertical surface without reducing the etching on a horizontal surface.

The use of formamidine disulphide is described in U.S. Pat. No. 3,033,725 as a passivating agent to prevent undercutting in copper etching solutions. U.S. Pat. No. 3,287,191 describes the use of an additive that reduces undercutting in printed circuit etching, wherein a metal more noble than copper has been deposited upon the copper. U.S. Pat. No. 3,161,552 describes the use of an additive which controls the character of the protective film which is used to prevent undercutting. All three of the aforementioned patents disclose undercutting inhibitors which are used in acid etching baths. Acid copper chloride baths etchs copper by the following ionic reaction:

$$Cu^{++} \quad Cu^\circ \longrightarrow 2Cu^+$$
Etchant  Metal  resultant cuprous ions and can be regenerated by chlorine gas as follows:

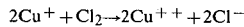
$$2Cu^+ + Cl_2 \rightarrow 2Cu^{++} + 2Cl^-$$

With proper controls, the etching rate can be maintained at a steady level. Unfortunately, the acidic nature of the etchant causes it to attack solder electroplating as rapidly as the copper itself. The only resists that can be used with acid etching are organic materials.

SUMMARY OF THE INVENTION

1. Purpose of the Invention

It is the principal object of the invention to provide an improved etching solution, and method of etching copper and copper alloys which eliminate the foregoing drawbacks.

It is another object of the invention to provide an improved ammoniacal alkaline etching solution and method of the character described which reduces undercutting.

It is another object of the invention to provide an improved etching solution and method of the character described which reduces the metallic resist overhang of an etched copper circuit.

It is another object of the invention to provide an improved etching solution, and method of the character described which provides more process tolerance in the etching operation.

Other objects of the invention in part will be obvious and in part will be pointed out hereinafter.

2. Brief Description of the Invention

In accordance with the present invention, a bath-soluble organic undercut inhibitor is incorporated into a high-speed ammoniacal alkaline cupric etching bath used to rapidly etch or dissolve copper and/or copper-containing alloys. Employing the organic undercut inhibitor of the present invention, it has been discovered that the amount of undercutting can be reduced significantly below the amount of undercutting without the use of said organic undercut inhibitor.

The organic undercut inhibitor of this invention can be either 5-nitro-1 H indazole or pyrazole.

The organic undercut inhibitor is incorporated in the aqueous alkaline ammoniacal cupric etching bath, being used in an amount between 0.05 g/l to the limit of solubility.

This invention specifically relates to the discovery that standard aqueous alkaline ammoniacal cupric etching baths for copper can be improved by the incorporation of the previously mentioned organic undercut inhibitors in the range specified. Typical of a standard aqueous alkaline ammoniacal cupric etching bath formulation is that described in U.S. Pat. No. 3,705,061. Such a bath includes cupric ions, an ammonium salt such as a chloride, ammonium hydroxide to achieve a pH between about 8 and about 10.5, water, and, if desired, some ammonium phosphate, whose purpose it is to prevent the darkening of any conventional solders which may be present on the copper substrate being etched.

Although the precise mechanism by which the amount of undercutting is reduced is not fully understood, the following are probable mechanisms of action:

A. The organic undercut inhibitor forms a bath-insoluble film on the copper surface being etched by combining with the cuprous copper produced in the etching reaction.

B. The organic undercut inhibitor forms soluble cupric compounds which become insoluble when reduced to the cuprous form.

C. The organic undercut inhibitor is reduced to an insoluble form by the cuprous reaction product on the surface of the copper being etched.

Whichever the precise mechanism of action is, it is clear that the presence of the organic undercut inhibitor causes the formation of a bath-insoluble, physically weak, etch-resistant film on the copper substrate. This etch-resistant film on the side walls of an etched depression serves to protect said side walls, thereby diminishing undercutting. Said etch-resistant film is broken at the bottom of the etched depression during the etching operation by controlling the direction at which droplets of the etching bath impinge on the bottom so that they strike the bottom at a substantial angle, e.g. perpendicularly.

By constantly breaking and reforming the etch-resistant film at the bottoms of the etched areas, it is possible to obtain unique directional etching normal to the surface of the copper substrate. The film is strong enough to substantially resist breaking when struck at acute angles, so that the films on the side walls tend to remain unbroken so as to retard or prevent substantial etching of the side walls in a directon lateral to the surface of the copper substrate.

It also is believed that the etch-resistant film contains cupric ions which oxidize and solubilize the metal copper with which they come into contact. However, such dissolution stops after the cupric ions are depleted. Consequently, if the etch-resistant film were deposited on all of the exposed copper, etching would essentially halt in a quiescent bath of an aqueous alkaline ammoniacal cupric etching formulation. However, the formation of the etch-resistant film at the bottoms of the etched area can be disrupted and hence removed therefrom without substantially affecting the retention of the etch-resistant film on the side walls of the etched area. This disruption of the etch-resistant film allows the metallic copper substrate, thus constantly freshly exposed, to be contacted by fresh cupric etching ions. Thus, where the etch-resistant film is disrupted or broken, etching of the copper substrate now unprotected by the film can continue; but where said film perseveres, unbroken or less frequently broken, etching is retarded.

The employment of the organic undercut inhibitor of the present invention in combination with an otherwise standard aqueous alkaline ammoniacal cupric etching bath has resulted in an improved etching bath with a decreased amount of undercutting.

DETAILED DESCRIPTION OF THE INVENTION

According to the present invention, it is preferred that the etching bath with the new organic undercut inhibitor be sprayed onto the copper substrate to be etched, but other well-known procedures for directing impinging streams or droplets onto the substrate may be used.

The typical spray etcher that may be used in the present invention comprises a synthetic plastic etching chamber and a synthetic plastic conveyor, e.g. helical rollers, to move the substrate such as printed circuit boards or work pieces through the etcher and into a rinse chamber and then out of the rinse chamber. Provision also is made for the conveyor to move the work pieces through the etching chamber at various speeds as well as to pump the etching bath from the sump of the etching chamber through numerous spray heads thereby causing droplets of the etching bath to forcefully impinge substantially perpendicularly upon the work piece or the printed circuit board surface. An example of a suitable etcher is the DEA 120 spray etcher (commercially available from DEA Products, Inc., Tempe, Ariz.).

When a spray etching system is employed, the etching bath of the present invention contacts the copper substrate in the following manner:

The etching bath, in the form of streams of droplets travels a course substantially perpendicular to the target copper substrate covered by a patterned resist and breaks any etch-resistant film on exposed copper areas which was formed after impingement of previous droplets. The droplets, of course, also strike the side walls of etched depressions, but the angle of incidence with the side walls is small enough for the protective film on the side walls not to tend to break.

Further, the etching bath also strikes the resist. This, however, is without significance since the resist is not aftected by contact with the droplets of the etching bath.

An alternative to the spray process is a paddle wheel that throws droplets off the paddle tips directed onto the target area.

As previously mentioned, in a preferred form of this invention, 5-nitro-1 H indazole is incorporated into an aqueous alkaline ammoniacal cupric etching bath. When 5-nitro-1 H indazole is added, it causes a physically weak protective film to be formed on the copper substrate and thereby provides the beneficial and advantageous effects of this invention.

In general, the decrease in the amount of undercutting obtained with 5-nitro-1 H indazole is between about 13 and about 34% less than the amount of undercutting present when using a conventional bath. These figures are obtained in test situations in which all boards are 100% overetched. In reality, when one is commercially etching boards, one etches 25% over breakthrough. Hence results in a commercial situation may differ quantitatively from those in the test situation. Qualitatively, the result will remain the same-undercutting will be substantially reduced with the undercut inhibitor of this invention.

The etching bath of the present invention has its various parameters adjusted to obtain commercially acceptable etching in a manner well known to the art. These parameters include the temperature of the etchant, the design and positions of the nozzles, the spray pressure at which the pumps furnish etchant to the nozzles for impingement on the copper substrate, the manner of contacting the copper substrate with the etching bath as referred to previously herein, and, of course, the concentrations of the standard ingredients of the aqueous alkaline ammoniacal cupric etching bath. All of these factors are selected for desired optimum etching conditions.

The only additional and non-conventional parameter for the practice of this invention is the presence and concentration of the organic undercut inhibitor to form the novel baths and method of this invention.

As previously mentioned, 5-nitro-1 H indazole should be incorporated in the standard aqueous ammoniacal etching bath in an amount between 0.05 g/l and the limit of solubility.

Preferably, 5-nitro-1 H indazole is incorporated in the etching bath in an amount between 0.09 and 0.24 g/l.

Excessive amounts of the organic undercut inhibitors of this invention are not desirable since beyond certain concentrations the percentage decrease in undercutting falls. However, in the range of 0.19 to 0.29 g/l for 5-nitro-1 H indazole there is a substantial plateau in the decrease of undercutting.

On the other hand, if insufficient organic undercut inhibitor is utilized in the etching bath, the decrease in the percentage of undercutting is not commercially significant. This lower limit has been found to be about 0.05 g/l for 5-nitro-1 H indazole.

The standard conventional aqueous alkaline ammoniacal cupric etching bath to which the undercut inhibitor is added pursuant to the present invention can vary as to its constituents. The following etching bath is illustrative of the ranges of ingredients of a suitable bath composition for use with the addition of undercut inhibitors of the present invention:

TABLE I

| Working Bath | Moles/Liter |
|---|---|
| Cupric ions as metallic copper | 1.0–2.8 |
| Ammonium chloride | 2.2–6.2 |
| Ammonium hydroxide | 2.0–9.0 |
| Ammonium phosphate-monobasic, $NH_4H_2PO_4$ | 0.001–0.10 |
| Water q.s. to | 1 liter |
| pH | 8.0–9.0 |

The cupric ions are supplied to the bath used in this invention by cupric salts such as cupric chloride, cupric nitrate, cupric acetate, cupric carbonate, cupric ammonium sulfate and the like; cupric chloride is preferred.

The standard aqueous alkaline ammoniacal cupric etching bath suitable for use in the practice of the present invention contains as the oxidizing complex, cupric ions in the form of a complex salt having the general formula $$Cu^{++}(Y)_x(Z^-)_n$$

wherein Y is the complexing agent; Z is the anion of the complex salt, n represents the mole ratio of anion to cupric ion and x represents the mole ratio of complexing agent which complexes with the cupricion, to cupric ion. The complexing agent employed may be either ammonia or a mixture of the ammonia and one or more chelating agents which will provide a bivalent cupric complex in the alkaline media.

Illustrative but in no wise limiting of the chelating agents for complexing cupric ions in conjunction with ammonia, there may be mentioned ethylenediamine tetraacetic acid, ethylenediamine, diethylenetriamine, triethylene, tetraamine, and B, B′, B″, tri(aminoethyl) amine and the like. The preferred chelating agents are those which have tetra or hexadentate properties and ethylenediamine tetraacetic acid is particularly preferred.

As the alkaline etching bath is used to dissolve copper, the resulting oxidized metallic copper and reduced cupric ions cause a buildup of cuprous ions. These must be oxidized back to the cupric state and because of the attendant loss of chemicals due to the continuous carry out of a portion of the etching bath from the system with etched work pieces, proper balance of the bath components should be maintained. A replenished solution is employed to control the pH range of the system, to make up for the withdrawn complexing agents for the copper and other ingredients and to dilute the copper concentration to an optimum level. Accordingly, the replenisher solution contains ammonium hydroxide for pH control and ammonium salts and/or chelating agents to complex with copper. No fresh copper ions are needed since when metallic copper is dissolved by a cupric ion it enters into solution in the form of a cuprous ion, while at the same time the etching cupric ion is reduced to cuprous form.

Among the useful ammonium compounds which may be employed, there may be mentioned ammonium hydroxide, ammonium carbonate, ammonium carbamate, ammonium sulfate, ammonium chloride, ammonium acetate, ammonium fluoride, ammonium phosphate and the like, as well as mixtures thereof. The preferred ammonium-based replenishing solution is one containing ammonium hydroxide and ammonium chloride and phosphates.

For the specific alkaline etching bath described above, the preferred replenisher solution has a specific gravity of about 1.0 and is added in amounts to maintain the etching bath at a pH above about 8.0, preferably between about 8.0 and about 9.0, optionally between about 8.3 and 8.5.

While the copper content of the standard alkaline etching baths may be varied widely, the preferred baths contain on the average from about 50 to about 100 or somewhat more grams of copper per liter, preferably from about 100 grams or less to about 200 grams or somewhat more per liter.

The temperature of the etching bath of this invention during the dissolution and etching of metallic copper can be room temperature or elevated temperatures up to about 135° F. The etching rate increases with increasing solution temperature. Temperatures of the etching solution much above 135° F. should be avoided, due to expulsion of ammonia gas at such higher temperature. A preferred temperature of operation is about 120° F. A one oz. per square foot copper circuit board (1.4 mils thick) will be effectively etched in approximately sixty seconds in a standard etching bath having a temperature of about 120° F. Copper layers of greater thickness require a greater etching time. The bath also can be used to etch circuit boards which are copper-coated on both sides.

The following preparations and examples illustrate one of the best modes presently known for conducting the process of this invention and of etching bath compositions employed therein.

PREPARATION A

5nitro-1 H indazole was used as the organic undercut inhibitor. This organic undercut inhibitor when incorporated into a standard etching both in an amount of 0.19 g/l provided an etching undercut decrease of about 34%.

EXAMPLE 1

The organic undercut inhibitor of Preparation A was employed in the process of the present invention in the following manner:

A copper clad (1.4 mils thick) epoxy board was plated with a solder etch-resist image to form a circuit pattern. The time to completely remove the unwanted copper and leave the image was determined. For test purposes the circuit board was then etched an equal time interval beyond that, i.e. twice the time required to complete etching.

A standard aqueous alkaline ammoniacal cupric etching bath having the following composition to establish the condition available according to the prior art processes was utilized:

TABLE I

| Working Bath | Moles/Liter |
|---|---|
| Cupric ions as metallic copper | 2.4 |
| Ammonium chloride | 5.4 |
| Ammonium hydroxide | 5.0 |
| Ammonium phosphate-mono-basic $NH_4H_2PO_4$ | 0.01 |
| Water q.s. to | 1 liter |

TABLE I-continued

| Working Bath | Moles/Liter |
|---|---|
| pH | 8.3–8.5 |
| Etchant Accelerator Optional | |

The standard amount of undercutting for 100% overetch was established. Undercutting was measured by dividing the width of the etchant resist of the resist for the circuit trace (B) minus the minimum width of the circuit trace (A) by 2.

$$\left( \frac{B - A}{2} = C \right)$$

The undercut amount thus determined was designated C and was 1.6 mils.

Next, there was incorporated in the etching solution of Table I, the organic undercut inhibitor of the present invention in the form of Preparation A. 0.096 g of this organic undercut inhibitor was incorporated for each liter of the standard aqueous alkaline ammoniacal cupric etching bath described above in this example. The circuit boards clad with copper (1.4 mils thick) were then etched twice the normal etching time (100% overetched).

The amount of undercut was determined. The amount of undercut using the etching bath of the present invention was designated by $U_1$. The decrease rate of undercutting was calculated using the following formula:

$$\frac{U_1 - C}{C} \times 100 = \% \text{ change in the amount of undercutting}$$

When the organic undercut inhibitor of Preparation A was employed, the undercut amount, $U_1$ was found to be 1.4 mils.

Consequently, a decrease of 13% in the amount of undercut (U) in contrast to the prior art undercut amount was measured using the etching-bath described.

EXAMPLE 2

Example 1 was repeated except that various amounts of the organic undercut inhibitor of Preparation A were added to the standard etching bath of Table I. The results of these runs are summarized on the following table:

TABLE II

| Run No. | g/l 5-Nitro-1H Indazole | Undercut | % Change |
|---|---|---|---|
| 1 | 0 | 1.6 mils | 0% |
| 2 | 0.096 | 1.4 | −13% |
| 3 | 0.15 | 1.3 | −19% |
| 4 | 0.19 | 1.06 | −34% |
| 5 | 0.24 | 1.08 | −33% |

As can be seen from Table II above, incorporation of the Preparation A undercut inhibitor to the standard etching-bath resulted in a marked decrease in the amount of undercut present in contrast to using the standard etching bath without the organic undercut inhibitor of the present invention.

PREPARATION B

Pyrazole was used as the organic undercut inhibitor. This organic undercutting inhibitor when incorporated into a standard etching bath in the amount of 0.1 g/l provided an etchant undercut decrease of 21%.

EXAMPLE 3

The organic undercut inhibitor of Preparation B was employed in the process of the present invention in the same manner as Preparation A was employed in Example 1; however, the standard amount of undercutting for double etching during this test series was 1.04 mils.

The same standard aqueous alkaline ammoniacal cupric etching-bath of Table I was used to establish the conditions available according to prior art processes.

The same formulae were utilized as in Example 1 to establish undercutting and the percentage change in undercutting.

Incorporated into the standard etching solution of Table I, in Example 1, was the organic undercut inhibitor of the invention in the form of Preparation B.

0.1 grams of this organic undercut inhibitor was incorporated for each liter of the standard aqueous alkaline ammoniacal etching-bath described previously in Example 1. Circuit boards were then etched twice the normal etching time (double etching).

When the organic undercut inhibitor of Preparation B was employed, in the aforementioned amount, the undercut amount was found to be 0.825 mils.

Consequently, a decrease of 21% in the amount of undercut in contrast to the prior art undercut amount was measured using the etching bath described.

EXAMPLE 4

Example 3 was repeated except that various amounts of the organic undercut inhibitor of Preparation B were added to the standard etching-bath of Table I. The results of these runs are summarized in the following table:

TABLE III

| Run No. | g/l Pyrazole | Undercut | % Change |
|---|---|---|---|
| 1 | 0 | 1.04 mils | 0% |
| 2 | 0.1 | 0.825 | −21% |
| 3 | 0.2 | 0.745 | −28% |
| 4 | 0.4 | 0.575 | −45% |
| 5 | 0.8 | 0.615 | −41% |

As can be seen from Table III above, incorporation of the Preparation B undercut inhibitor to the standard etching-bath resulted in a marked decrease in the amount of undercut present in contrast to using the standard etching-bath without the organic undercut inhibitor of the present invention.

Having thus described the invention, there is claimed as new and desired to be secured by Letters Patent:

1. In an improved ammoniacal alkaline etchant solution for etching copper and copper-containing alloy traces on substrates having resist-coated areas and non-coated areas, the improvement comprising,
    an organic undercut inhibitor for reducing the amount of undercutting beneath the resist-coated areas that lie above the copper traces, said organic undercut inhibitor being 5-nitro-1 H indazole.

2. In an improved ammoniacal alkaline etchant solution for etching copper and copper-containing alloy traces on substrates having resist-coated areas and non-coated areas, the improvement comprising,
    an organic undercut inhibitor for reducing the amount of undercutting beneath the resist-coated areas that lie above the copper traces, said organic undercut inhibitor being pyrazole.

3. An improved ammoniacal alkaline etchant solution for etching copper and copper-containing alloy traces on substrates, having resist-coated areas and non-coated areas consisting essentially of:

| | |
|---|---|
| cupric ions as metallic copper | 1.0–2.8 moles/liter |
| ammonium chloride | 2.2–6.2 moles/liter |
| ammonium hydroxide | 2.0–9.0 moles/liter |
| ammonium phosphate-mono-basic, NH$_4$H$_2$PO$_4$ | 0.001–0.10 moles/liter |
| 5-nitro-1H Indozole | 0.096–0.24 g/liter |
| Water q.s. to | 1 liter |

4. A method of reducing the amount of undercutting beneath the resist-coated areas that lie above the copper and copper-containing alloy traces, on substrates, comprising the steps of:

(a) providing an ammoniacal alkaline etching solution consisting essentially of: cupric ions ammonium chloride; ammonium hydroxide; ammoniun phosphate-mono basic and water, and (b) incorporating into said ammoniacal alkaline etching solution an organic undercut inhibitor for reducing the amount of undercutting beneath the resist-coated areas that lie above the copper traces, said organic undercut inhibitor being 5-nitro-1 H indazole.

5. A method of reducing the amount of under-cutting beneath the resist-coated areas that lie above the copper and copper-containing alloy traces, or substrates, comprising the steps of:

(a) providing an ammoniacal alkaline etching solution consisting essentially of: cupric ions; ammonium chloride; ammonium hydroxide; ammonium phosphate-mono basic and water, and (b) incorporating into said ammoniacal alkaline etching solution an organic undercut inhibitor for reducing the amount of undercutting beneath the resist-coated areas that lie above the copper traces, said organic undercut inhibitor being pyrazole.

* * * * *